March 2, 1965 R. C. BARON ETAL 3,172,051

EMITTER FOLLOWER AMPLIFIER

Filed July 23, 1962 2 Sheets-Sheet 1

INVENTORS
ROBERT C. BARON
T. PAUL BOTHWELL
BY Alfred H. Rosen
Robert J. Schiller
ATTORNEYS

ROBERT C. BARON
T. PAUL BOTHWELL
INVENTORS
BY
ATTORNEYS

United States Patent Office 3,172,051

Patented Mar. 2, 1965

3,172,051

EMITTER FOLLOWER AMPLIFIER

Robert C. Baron, Brookline, and Theodore Paul Bothwell, Natick, Mass., assignors to Computer Control Company, Inc., Framingham, Mass., a corporation of Delaware Filed July 23, 1962, Ser. No. 211,632
8 Claims. (Cl. 330—17)

The present invention relates to electronic circuits, and more particularly to power amplifier circuits.

In order to obtain the rapid response desired in high-speed computer applications, emitter followers have been used as current amplifiers for interstage power amplification. Their typical operation is described in the Handbook of Semiconductor Electronics, Lloyd P. Hunter, 1st edition, McGraw-Hill Book Co., 1956 at paragraph 15.9. When used with pulse logic, as contrasted to D.C. level logic, emitter follower amplifiers have an output waveform dependent upon the nature of the load. Where the load has a material capacitive value, usually distributed, it will tend to degrade the output. For instance, if the input waveform to the amplifier is a square-wave, the output will resemble a capacitor charge-discharge type of skew-peaked sawtooth.

It is known that an NPN emitter follower employing a positive going transient signal will drive the load positively. However, a PNP emitter follower with a negative-going input transient will drive a load negatively. But, in the steady state condition, both transistor types through their complementary symmetry properties, can be formed into a composite emitter follower capable of driving a load positively with both positive and negative D.C. input signals. Devices of this type are used to drive capactive loads at much higher operating speeds than can be achieved through single-transistor emitter followers. However, the problem of degradation of output waveform remains a serious impediment in electronic systems requiring response fidelity, as in digital pulse devices.

The present invention therefore has as a principal object the provision of a composite emitter follower circuit in which the output waveform follows the input waveform regardless of wide variations in the capactive nature of the load. This object is effected through the provision of a circuit capable of driving large values of D.C. and capacitive loads without materially loading the input, and particularly by a composite transistor circuit which during the steady state has a current gain equivalent to the product of the gains of the unit transistors, and during the transient condition possess a transient current gain equivalent to the gain of a unit transistor driven through a diode.

Other objects of the invention are to provide a new and improved composite transistor amplifier in which one transistor is cut off by an input signal transient of one sense and another transistor is cut off by an input signal transient of opposite sense; to provide an amplifier of the type described in which each transistor is coupled to a unilateral current conducting device which functions to speed up the transition from the "off" to "on" state of the opposite transistor; and to provide an amplifier of the type described which is relatively insensitive to the capacitive nature of the amplifier load.

These and other objects of the present invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims.

Figure 1:
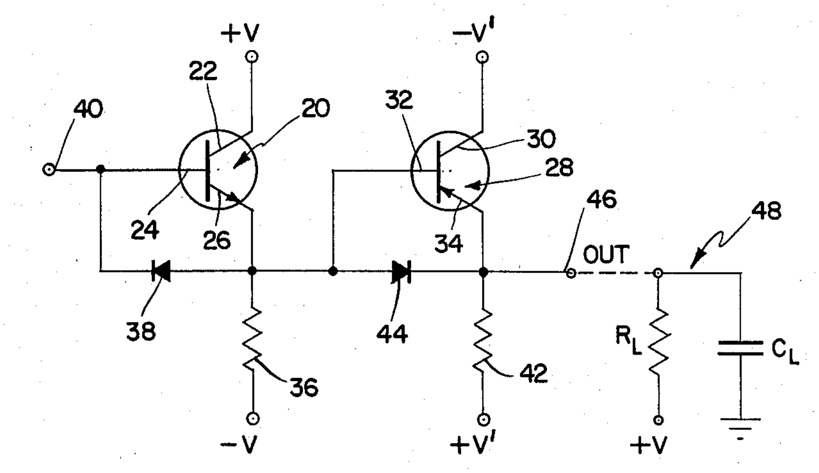
FIG. 1 is a schematic circuit embodying the principles of the present invention.

Referring now to FIG. 1, there is shown an emitter follower amplifier circuit which includes a first transistor 20 having collector, base and emitter electrodes 22, 24 and 26 respectively. Transistor 20, in the form shown, is an NPN conductivity type transistor. The invention also includes second transistor 28, a PNP conductivity type, having collector, base and emitter electrodes 30, 32 and 34, respectively.

Transistor 20 is connected in circuit in an emitter follower configuration in which the collector is common to both the input and output circuits of the transistor. Transistor bias is provided from a positive voltage source +V connected to collector 22, the negative potential −V being connected to emitter 26 through resistor 36. Series coupled between the base and emitter of transistor 20 is a unilateral current conductive device, such as diode 38, poled so that its cathode is connected to base 24 and its anode to emitter 26. Diode 38 may be gas-filled or solid state germanium, silicon or the like. An input terminal 40, at which an input signal is intended to be imposed on the amplifier circuit, is provided connected to base 24.

Emitter electrode 26 of the first transistor is connected directly to base 32 of the second or complementary transistor 28 which is also in emitter follower configuration. Bias is provided for the latter transistor from a positive potential $+V^1$ connected through resistor 42 to emitter 34, the negative voltage $-V^1$ being in turn connected to collector 30. It will be apparent that where transistors 20 and 28 are matched complementary transistors having similar $V_{CE}$ ratings so that $V \approx V^1$, a common bias source may be employed and resistors 36 and 42 are preferably equal in value. A second diode 44, similar to diode 38, is also provided with its cathode directly coupled to emitter 34 and its anode directly connected to base 32. An output signal tap 46 is provided connected to emitter 34 and a typical load 48 is shown coupled to tap 46. Load 48, for example, comprises a D.C. load $R_L$ and a capacitive load $C_L$.

For the purposes of discussing the operation of the circuit heretofore described, it will be assumed that the D.C. load shown as $R_L$ connected to output tap 46 is returned to a positive voltage +V. If the load is returned to a negative voltage then the relative position of the NPN and PNP transistors would be interchanged with appropriate modifications in the polarity of the biasing voltages and the polarities of diodes 38 and 44. It can be assumed that the input voltage signal at terminal 40 is at a potential $E_I$ where $+V > E_I > -V$. If $E_I$ is steady state, then both transistors 20 and 28 are conducting, diodes 38 and 44 are reversed biased, and the output voltage at tap 46 is at $E_O \approx E_I - V_{BE1} + V_{BE2}$. Since $V_{BE1}$ is approximately equal to $V_{BE2}$, the former being the base-emitter voltage of transistor 20 and the latter being the base emitter voltage of transistor 28, then $E_O \approx E_I$. This approximate equivalent relation will subsist as long as $E_I$ is at a D.C. level between +V and −V which insures that the transistors do not become saturated.

Thus the output follows the input voltage to the accuracy of $V_{BE1} - V_{BE2}$. With proper choice of transistors this difference in base-emitter voltages can be minimized so that the output follows the input with high accuracy.

The principal advantage of the circuit occurs in the transient condition. Since an emitter follower only provides transient gain as it is turned on, diodes 38 and 44 function as "speed up" diodes as each emitter follower is being pulled in the off direction.

Figure 2:
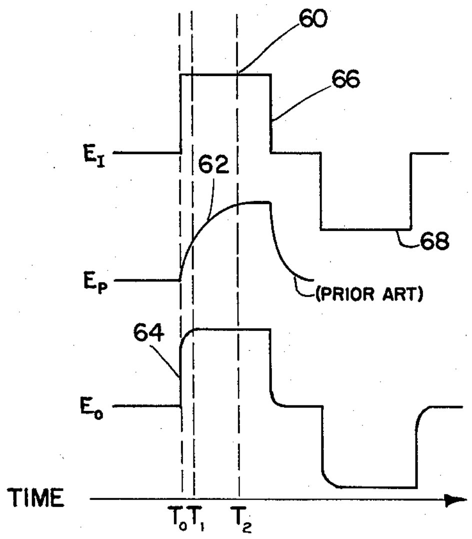
FIG. 2 are exemplary waveforms of typical input and output signals of the circuit of FIG. 1, compared with output signals of prior art emitter followers.

Referring particularly to FIG. 2 there will be shown three waveforms having a common time axis. The waveform labeled $E_I$ is a typical square wave input pulse intended to be applied at terminal 40. Now, assuming that diodes 38 and 44 are not in the circuit of FIG. 1, if $E_I$ changes rapidly, for example by introduction of the positive-going edge of square wave pulse 60 to input terminal 40 at time $t_0$, $C_L$ in the load will charge along a typical voltage curve such as that identified as portion 62 of waveform $E_P$ of FIG. 2. The voltage across $C_L$ will reach the level of $E_I$ ultimately at time $t_2$ according to the RC constant of load 48. The output waveform $E_P$ is therefore a distortion of the input waveform of $E_I$ and is typical of the prior art.

However, the presence of diodes 38 and 44 in the circuit provides a substantially improved output waveform such as is shown at $E_O$ in FIG. 2. When positive-going square wave 60 is introduced at terminal 40 at $t_0$, transistor 20 is biased on more strongly. This moves the potential at emitter 26 more positively and momentarily biases transistor 28 off, while forward biasing diode 44. Thus, a current from transistor 20 through diode 44 is provided for charging $C_L$ rapidly, as along curve 64 of $E_O$ in FIG. 2. The output voltage of waveform $E_O$ reaches the approximate value of $E_I$ in time $t_1$, a much lesser interval than $t_2$. The rise of the output waveform therefore much more closely approximates the positive going edge of the input waveform. As $E_O$ approaches the value of $E_I$, diode 44 is again reverse biased while transistor 28 resumes conduction, the circuit then being in a steady state.

Application of the negative going edge 66 of square wave 60 to terminal 40 causes transistor 20 to be momentarily turned off and diode 38 transiently forward biased. This transiently moves emitter 26 negatively and imposes the negative charge on base 32 of transistor 28 to force the latter to conduct more strongly, pulling emitter 34 more negatively.

As emitter 34 moves negatively it forces $C_L$ to discharge rapidly according to the time constant $$\frac{R_X C_L}{B}$$

where B is the transient current gain of transistor 28, and $R_X$ is the total resistive impedance looking back into the circuit from $C_L$.

In summary then, with a positive going input signal, the output is pulled positive by both transistor 20 and diode 44; with an input signal in the negative direction, the output is pulled negatively by transistor 28 and diode 38. In both cases the charging and discharging of $C_L$, the capacitive portion of the load, is considerably speeded up by the transient current carrying operation of the momentarily forward biased respective diode.

It will be seen that for a negative going square wave, such as portion 68 of waveform $E_I$ of FIG. 2, as long as the input peak voltage does not exceed $-V$, the output waveform will, for the same reasons heretofore adduced, closely approximate the input waveform.

Typical circuit values in an operational embodiment of the present invention would be as follows:

| | |
|---|---|
| Peak $E_I$ ---volts-- | 3 |
| +V ---do--- | 6 |
| −V ---do--- | 6 |
| Resistor **36** --- | 15KΩ |
| Resistor **42** --- | 15KΩ |
| Transistor **20** --- | 2N708 |
| Transistor **28** --- | 2N722 |
| $R_L$ --- | 1KΩ |
| $C_L$ ---μμf-- | Up to 1000 |
| Diodes **38** and **44** --- | 1N914 |

Figure 3:
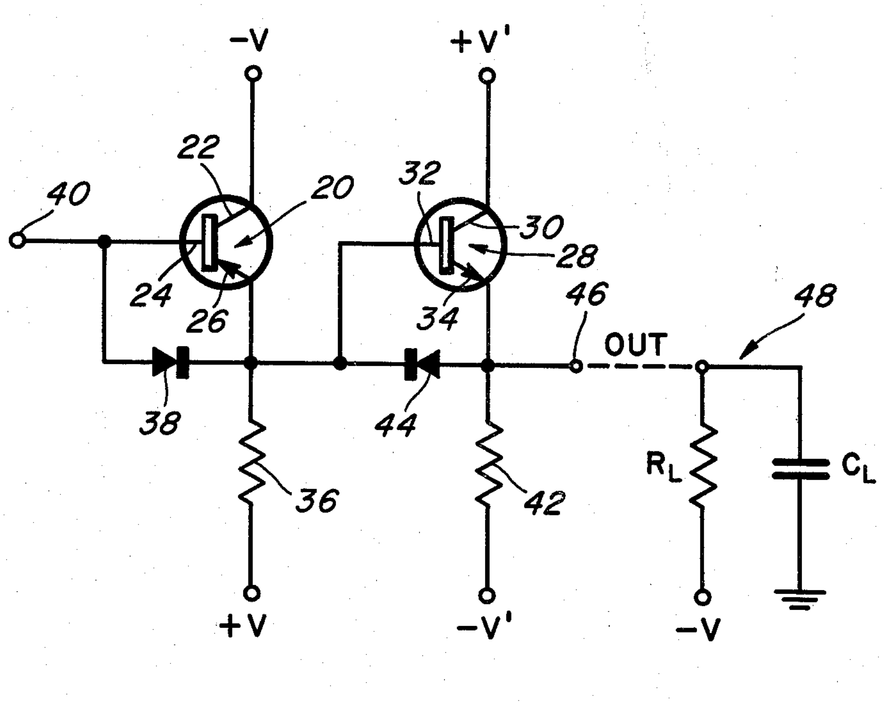
FIG. 3 is a schematic circuit embodying the principles of the present invention showing how the relative positions of the transistor stages of FIG. 1 may be rearranged for negative load voltages.

For the embodiment wherein the load is returned to a negative voltage, reference is now made to FIG. 3 wherein the elements noted therein are similarly numbered with respect to corresponding elements of FIG. 1. In this latter embodiment, the first or input stage 20 is now a PNP transistor while the second stage 28 is an NPN transistor. It should be noted that diodes 38 and 44 are now oppositely poled with regard to their corresponding counterparts in FIG. 1 but are appropriately poled with regard to the transistors with which they are associated. It should also be noted that transistor 20 now has a negative voltage $-V$ applied to collector 22 and a positive voltage $+V$ applied to one end of resistor 36, the other end thereof being connected to the emitter electrode 26 of transistor 20. Similarly, there is now a positive voltage $+V'$ applied to collector electrode 30 of transistor 28 and a negative voltage $-V'$ applied to one end of resistor 42, the other end thereof being connected to the emitter electrode 34 of transistor 28. Load 48 is shown being returned to a negative voltage $-V'$.

Thus, when the load is returned to a negative voltage, the relative positions of the transistors are reversed, along with appropriate modifications in the polarities of the biasing voltages and the polarities of diodes 38 and 44, to achieve the same results as previously set forth with regard to the description of FIG. 1.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. An amplifier circuit comprising, in combination, first and second transistor means of opposite conductivity types, said transistor means being connected in emitter follower configuration with the emitter of the first transistor means being connected to the base of said second transistor means, the base of said first transistor means being a terminal for input signals and the emitter of said second transistor means being a terminal for output signals:
   - a pair of unilateral current conducting means having a like electrode of each connected to one another, and being connected in series between the base of said first transistor means and the emitter of said second transistor means; and
   - means for connecting said like electrodes to the base of said second transistor means.

2. An amplifier circuit for driving capacitive loads without distortion of the load driving signal, said circuit comprising in combination:
   - first and second transistors of opposite conductivity type connected in emitter follower configuration with the base of the first transistor being a terminal for input signals and the emitter of the second transistor being a terminal for output signals;
   - the emitter of the first transistor and the base of the second transistor being connected to one another;
   - first and second two-electrode unilateral current conducting means, one having an electrode connected to a like electrode of the other, the other electrodes being respectively connected to said input and output terminals;
   - said first unilateral current conducting means being so poled as to be non-conducting during the conductive state of said second transistor and conducting when said second transistor is transiently biased not conductive;
   - and means for connecting said like electrodes to the base of said second transistor.

3. An amplifier circuit as defined in claim 2 wherein said first transistor is a PNP conductivity type, said second transistor is an NPN conductivity type and wherein said like electrodes are cathodes and said unilateral current conducting means are coupled cathode to cathode.

4. An amplifier circuit as defined in claim 2 wherein said first transistor is an NPN conductivity type, said second transistor is a PNP conductivity type, and wherein said like electrodes are anodes and said unilateral current conducting means are coupled anode to anode.

5. An amplifier circuit as defined in claim 4 wherein said unilateral current conducting means are solid state diodes.

6. An amplifier circuit, comprising, in combination, first and second transistor means of opposite conductivity types, said transistor means being connected in emitter follower configuration:

means for connecting the emitter of the first transistor to the base of the second transistor means;

means for connecting the base of said first transistor means to its emitter through a first unilateral current conducting means and for connecting the base of said second transistor means to its emitter through a second unilateral current conducting means so that, upon application of a transient voltage input signal of predetermined polarity to the base of said first transistor means, one of a first combination of the first transistor means and the second unilateral current conducting means or a second combination of said second transistor means and first unilateral current conducting means produces at the emitter of said second transistor means an output having a waveform closely approximating said input signal;

and upon application of a transient voltage signal of opposite polarity to the base of said first transistor means, the other combination of first or second combination produces at the emitter of said second transistor means an output having a waveform closely approximating said input signal.

7. An amplifier circuit as defined in claim 6 wherein said first transistor means is an NPN transistor, said second transistor means is a PNP transistor, and said unilateral current conducting means are diodes.

8. An amplifier circuit as defined in claim 6 wherein said first transistor means is a PNP transistor, said second transistor means is an NPN transistor, and said unilateral current conducting means are diodes.

No references cited.

ROY LAKE, *Primary Examiner.*

NATHAN KAUFMAN, *Examiner.*